United States Patent
Shih et al.

(10) Patent No.: US 6,794,266 B2
(45) Date of Patent: Sep. 21, 2004

(54) METHOD FOR FORMING A TRENCH ISOLATION STRUCTURE

(75) Inventors: Shing-Yih Shih, Taipei (TW); Chien-Mao Liao, Banchiau (TW); Chang Rong Wu, Banchiau (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/330,660

(22) Filed: Dec. 27, 2002

(65) Prior Publication Data

US 2004/0038493 A1 Feb. 26, 2004

(30) Foreign Application Priority Data

Aug. 22, 2002 (TW) ........................................ 91118974 A

(51) Int. Cl.[7] ............................................. H01L 21/76
(52) U.S. Cl. ....................................... 438/422; 438/427
(58) Field of Search ................................ 438/422, 427

(56) References Cited

U.S. PATENT DOCUMENTS

| | | | | |
|---|---|---|---|---|
| 5,801,082 A | * | 9/1998 | Tseng | 438/424 |
| 5,830,797 A | * | 11/1998 | Cleeves | 438/296 |
| 6,232,228 B1 | * | 5/2001 | Kwag et al. | 438/669 |
| 6,479,376 B1 | * | 11/2002 | Huang et al. | 438/613 |
| 6,566,229 B2 | * | 5/2003 | Hong et al. | 438/435 |
| 6,596,607 B2 | * | 7/2003 | Ahn | 438/424 |
| RE38,363 E | * | 12/2003 | Gocho et al. | 438/427 |
| 6,699,799 B2 | * | 3/2004 | Ahn et al. | 438/781 |
| 2003/0054616 A1 | * | 3/2003 | Endisch et al. | 438/400 |

FOREIGN PATENT DOCUMENTS

| | | | | |
|---|---|---|---|---|
| JP | 404067634 A | * | 3/1992 | |
| JP | 404152551 A | * | 5/1992 | |

* cited by examiner

*Primary Examiner*—Matthew Smith
*Assistant Examiner*—Chuong Anh Luu
(74) *Attorney, Agent, or Firm*—Quintero Law Office

(57) ABSTRACT

A method for forming a trench isolation structure. First, a substrate having at least one trench is provided. The trench is filled with a spin on glass (SOG) layer. Subsequently, a baking is performed on the SOG layer. The SOG layer is etched back to a predetermined depth. Next, a curing is performed on the remaining SOG layer. Finally, an insulating layer is formed on the remaining SOG layer to fill the trench completely.

27 Claims, 6 Drawing Sheets

METHOD FOR FORMING A TRENCH ISOLATION STRUCTURE

BACKGROUND OF THE INVENTION

1. Field of the Invention

The invention relates to a method for forming a trench isolation structure, and more particularly to a method for forming a shallow trench isolation structure (STI) with high aspect ratio (AR).

2. Description of the Related Art

Recently, as the manufacturing techniques of semiconductor integrated circuits develop, the number of devices in a chip increases. The size of the device decreases as the degree of integration increases. However regardless of the reduction of the size of the device, adequate insulation or isolation must be formed among individual devices in the chip so that good device characteristics can be achieved. This technique is called device isolation technology. Among different device isolation techniques, local oxidation of silicon (LOCOS) and shallow trench isolation (STI) manufacturing methods are the two most used methods. In particular, as the latter has a small isolation region and can keep the substrate level after the process is finished, it is the semiconductor manufacturing method obtaining the most attention.

In the conventional STI method, an insulating layer is filled in the trench of the substrate by chemical vapor deposition (CVD). Thereafter, the excess insulating layer deposited on the substrate is removed. However, since the aspect ratio of the trench is raised by increasing the integration of the integrated circuit, the conventional deposition apparatus cannot completely fill the trench with insulating layer due to insufficient gap filling ability. Accordingly, poor insulation results, degrading the reliability of the device.

FIGS. 1a to 1c are cross-sections of the conventional method for forming a shallow trench isolation structure. First, in FIG. 1a, a substrate 100, such as a silicon wafer, is provided. Next, a pad oxide layer 102, a pad nitride layer 104 and a patterned photoresist layer 106 are successively formed on the substrate 100. The patterned photoresist layer 106 has a plurality of openings 106a to expose the pad nitride layer 104.

Next, in FIG. 1b, the pad nitride layer 104, the pad oxide layer 102, and the substrate 100 under the openings 106a are successively etched to form trenches 108 with high aspect ratio (AR≧3) in the substrate 100. Thereafter, the patterned photoresist layer 106 is removed.

Finally, in FIG. 1c, a silicon oxide layer 110 formed by high-density plasma CVD (HDPCVD) is deposited on the pad nitride layer 104 and in the trenches 108. However, since the conventional CVD apparatus with insufficient gap filling ability cannot completely fill the trenches 108 with HDP oxide layer 110, voids 110a are created in the HDP oxide layer 110 in the trenches 108. As a result, poor isolation between devices reduces the reliability of the devices.

SUMMARY OF THE INVENTION

Accordingly, an object of the invention is to provide a method of forming a shallow trench isolation structure using an insulating material with good gap filling ability to fill in the trench, thereby reducing the aspect ratio of the trench to prevent voids or seams in the shallow trench isolation structure.

To achieve these and other advantages, the invention provides a method of forming a shallow trench isolation structure. First, a substrate having at least one trench of aspect ratio more than 3 is provided. Next, the trench is filled with a spin on glass (SOG) layer. Thereafter, a baking is performed on the SOG layer at below 400° C. for 30~60 min. Next, the SOG layer is etched back to a predetermined depth using buffer oxide etch solution (BOE). The proportional volume of ammonium fluoric ($NH_4F$) to hydrofluoric (HF) acid in BOE is about 50~200:1. Next, a curing is performed on the remaining SOG layer at 750° C.~1000° C. for 30~60 min. The highest temperature of the curing is based on the temperature of subsequent annealing, and both temperatures are substantially equal. Next, an insulating layer is formed on the remaining SOG layer to fill the trench completely. The insulating layer can be high-density oxide. Finally, the insulating layer is annealed.

DESCRIPTION OF THE DRAWINGS

For a better understanding of the present invention, reference is made to a detailed description to be read in conjunction with the accompanying drawings, in which.

DETAILED DESCRIPTION OF THE INVENTION

A preferred embodiment of the present invention is now described with reference to FIGS. 2a through 2g.

Figure 1A:
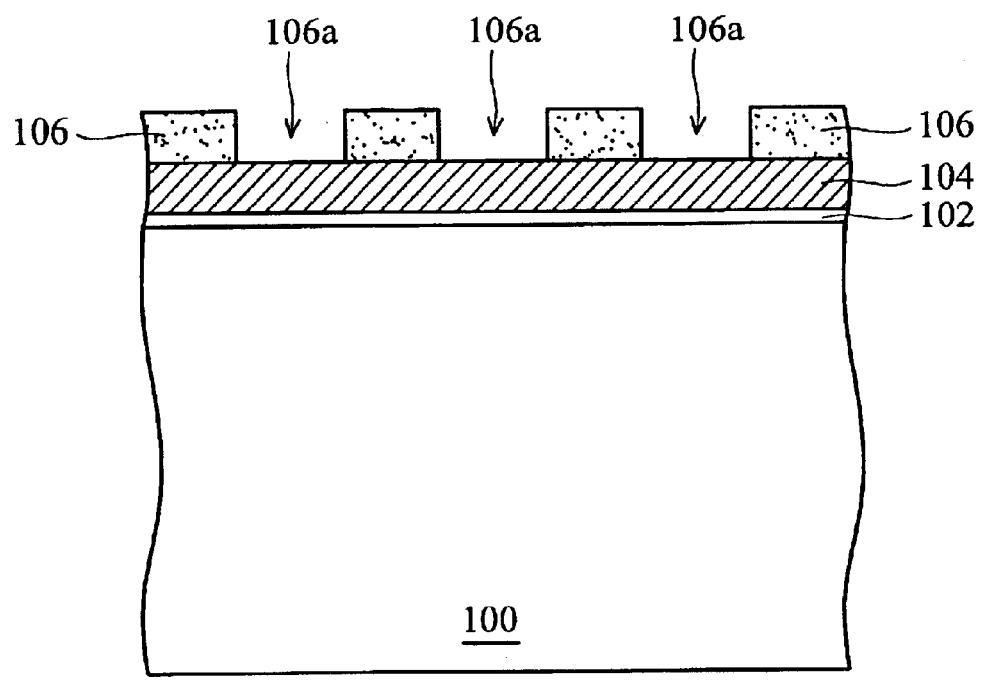
FIGS. 1a to 1c are cross-sections of the conventional method for forming a shallow trench isolation structure.
Figure 1B:
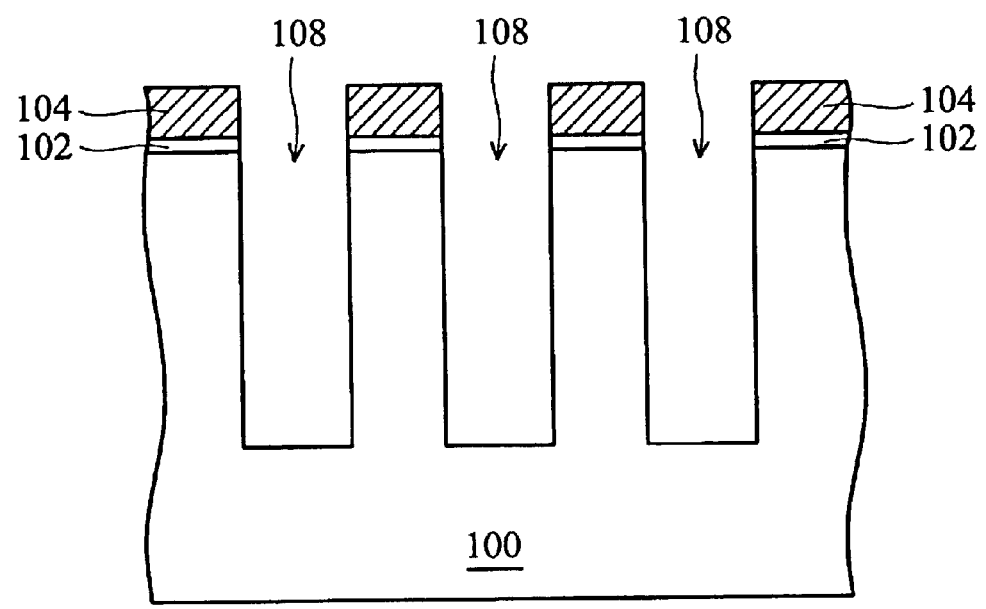
Figure 1C:
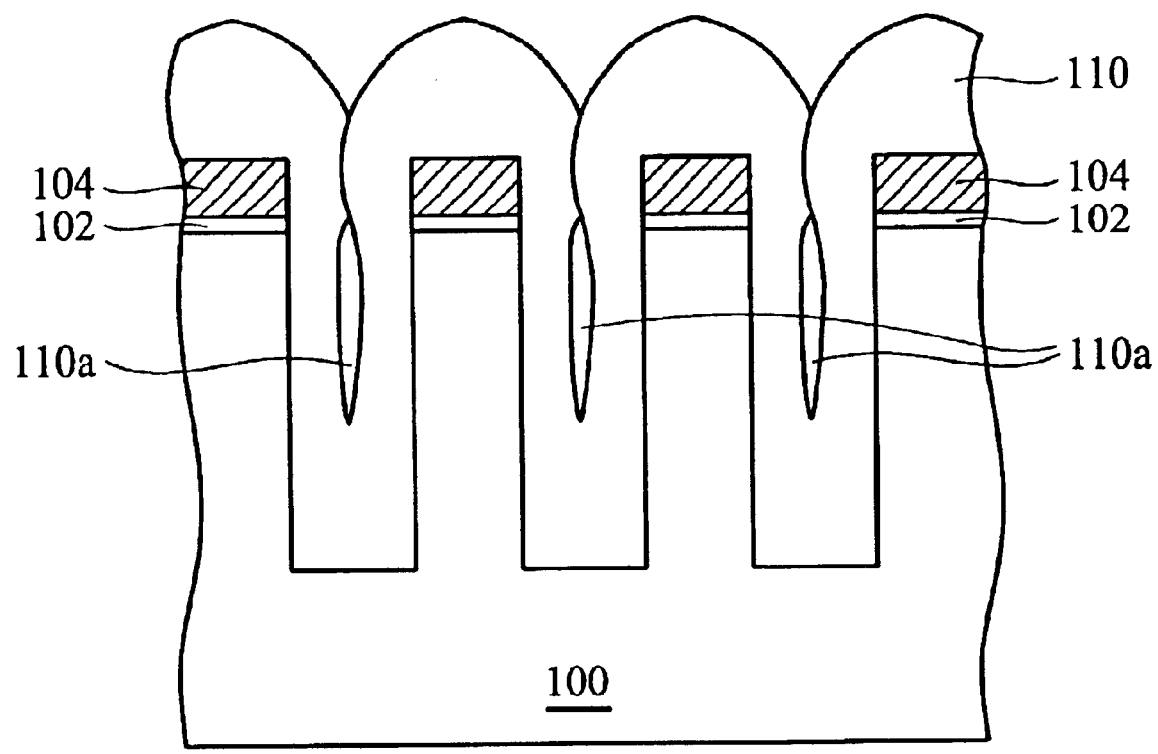
Figure 2A:
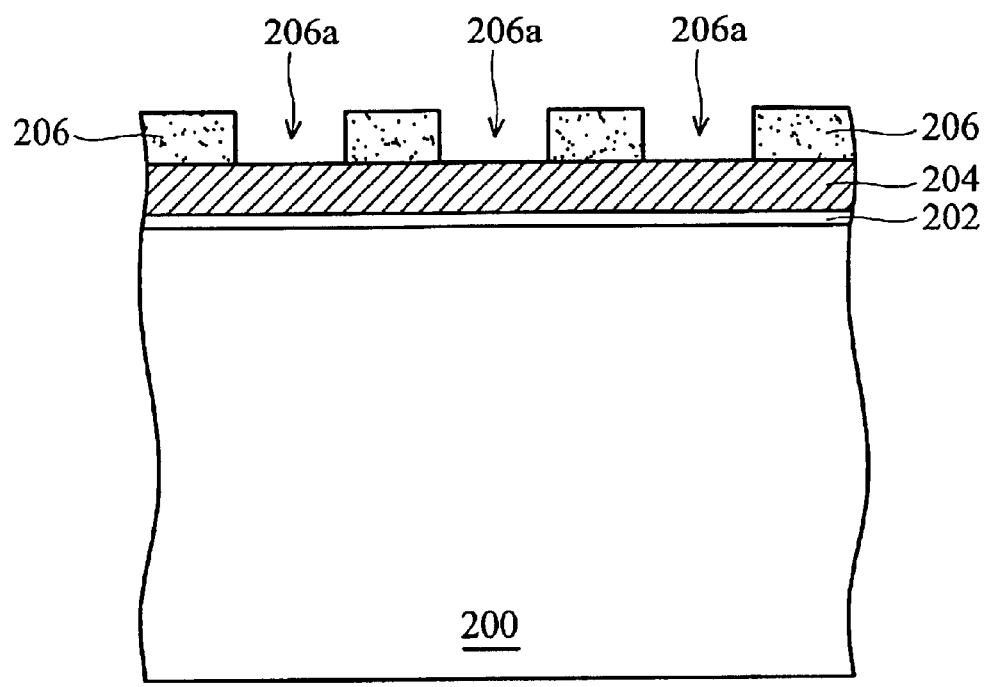
FIGS. 2a through 2g are cross-sections showing a method of forming a shallow trench isolation structure according to the present invention.

In FIG. 2a, first, a substrate 200, such as a silicon wafer, is provided. A mask layer is formed on the substrate 200. The mask layer can be a single layer or a plurality of layers. In this invention, the mask layer is preferably composed of a pad oxide layer 202 and a thicker pad nitride layer 204. The pad oxide layer 202 has a thickness of about 50~200 Å and can be formed by thermal oxidation or conventional CVD, such as atmospheric pressure CVD (APCVD) and low pressure CVD (LPCVD). The pad nitride layer 204 overlying the pad oxide layer 202 has a thickness of about 500~2000 Å and can be formed by LPCVD using $SiCl_2H_2$ and $NH_3$ as reaction source. Next, a patterned photoresist layer 206 is coated on the pad nitride layer 204. The patterned photoresist layer 206 has a plurality of openings for defining dense and isolated trenches. Here, in order to simplify the diagram, only openings 206a for defining dense trenches are shown.

Figure 2B:
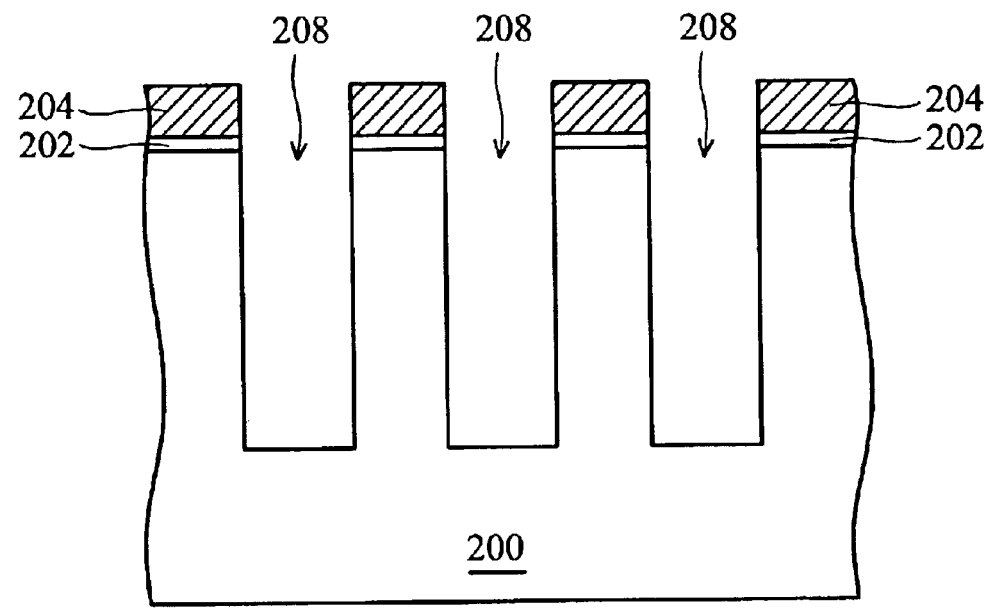

Subsequently, in FIG. 2b, the patterned photoresist layer 206 is used as a mask to dry etch the pad nitride layer 204 and the underlying pad oxide layer 202 to transfer the pattern of the photoresist layer 206 to pad nitride layer 204 and the pad oxide layer 202. Next, silicon substrate 200 is dry etched to a predetermined depth using the pad nitride layer 204 and pad oxide layer 202 as an etch mask to form trenches 208 inside. In this invention, the aspect ratio of these trenches 208 is more than 3. Then, the photoresist layer 206 on the pad nitride layer 204 is removed.

Figure 2C:
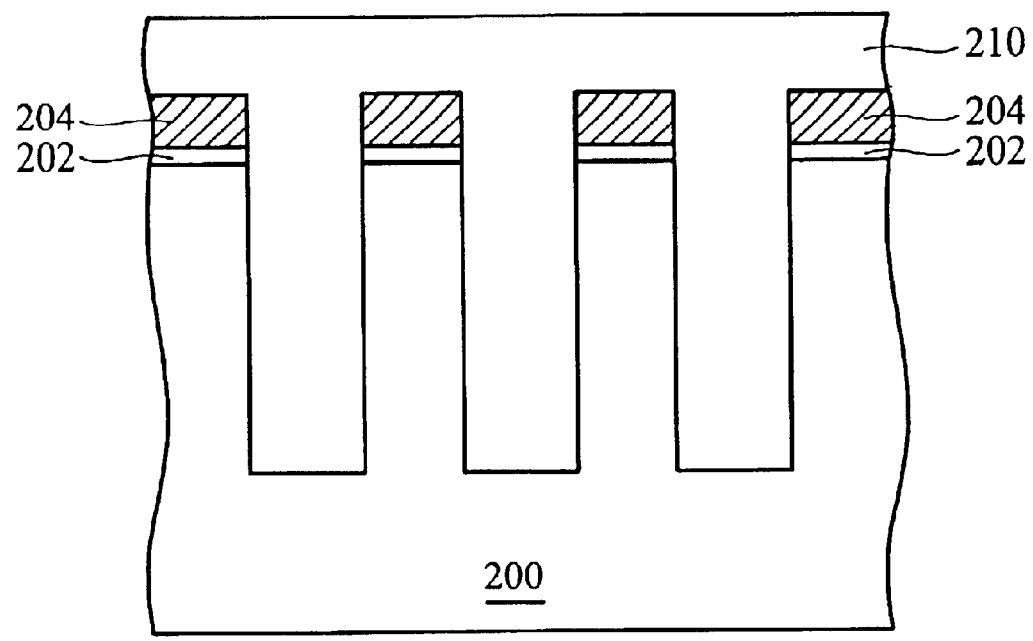
Figure 2D:
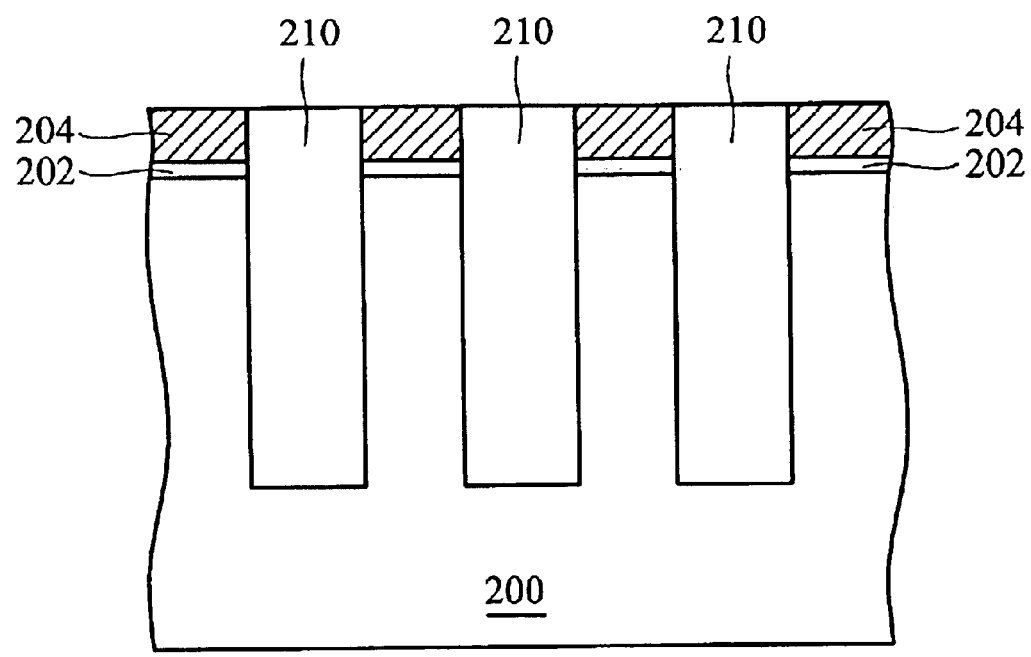
Figure 2E:
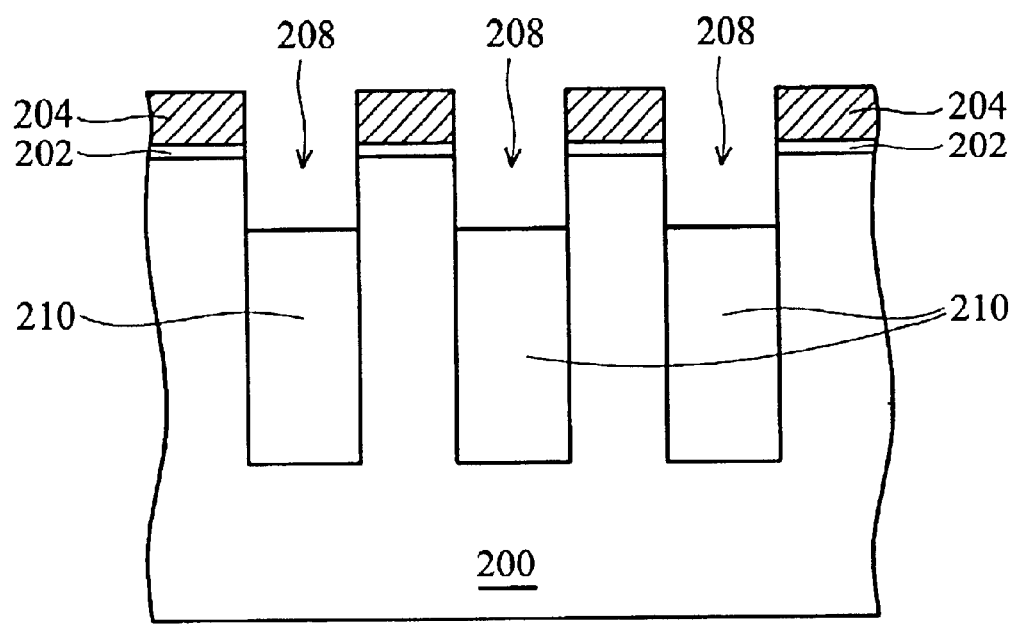

Next, FIGS. 2c to 2e show the critical steps of the invention. In FIG. 2c, an insulating layer 210 is deposited on the pad nitride layer 204 and fills the trenches 208 by deposition. In this invention, in order to avoid voids or seams created in the insulating layer 210 formed in these trenches 208 with high aspect ratio (AR>3), the spin on glass (SOG) is used as the insulating layer 210. Thereafter, a low temperature baking or curing, such as below 400° C., is performed on the insulating layer 210 for 30~60 min.

Next, in FIG. 2d, after the low temperature baking, an optional polish process, such as chemical mechanical polishing (CMP), is performed on the SOG layer 210 using the pad nitride layer 204 as a etch stop layer. The object of the polishing step is to level the SOG layer 210 formed in the dense trenches 208 and isolated trenches (not shown), thereby expediting the subsequent process steps.

Next, in FIG. 2e, the SOG layer 210 fills the trenches 208 is etched back to a predetermined depth, such as 500~1000 Å. The SOG layer 210 can be etched using buffer oxide etch solution (BOE). In this invention, the proportional volume of ammonium fluoric ($NH_4F$) to hydrofluoric (HF) acid in BOE is about 50~200:1, and the preferred proportional volume of $NH_4F$ to HF acid in BOE is about 100:1. Under this condition (baking below 400° C., $NH_4F$:HF=100:1), damage to the sidewall of the remaining SOG layer 210 fills the trenches 208 and large seams forming therein due to etching and difficult to fill high-density plasma oxide (HDP oxide) fills the trenches 208 can be prevented, thereby ensuring the reliability of the isolation structure. Moreover, better process control can be accomplished due to the substantially equal etch rate for the SOG layer 210 in the dense trenches 208 and isolated trenches. Next, a high temperature curing, such as 750° C.~1000° C., is performed on the remaining SOG layer 210 for 30~60 min. The object of the high temperature curing is to enhance the chemical structure stability of the SOG layer 210. The highest temperature of the high temperature curing is based on the temperature of annealing after CMP, and both temperatures are substantially equal.

Figure 2F:
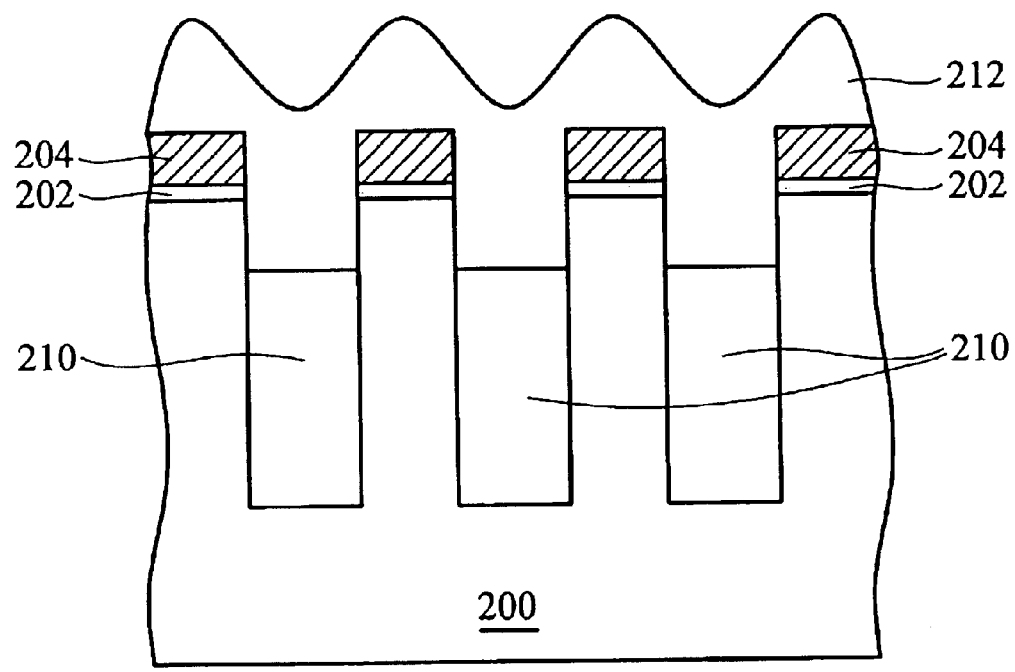

Next, in FIG. 2f, an insulating layer 212, such as silicon oxide formed by HDPCVD, is deposited on the pad nitride layer 204, and fills the trenches 208. Compared with the prior art, in the present invention, since the AR of the trenches 208 can be reduced (AR<3) by filling SOG layer 210 therein, the insulating layer 212 can be fills the trenches 208 without voids or seams therein.

Figure 2G:
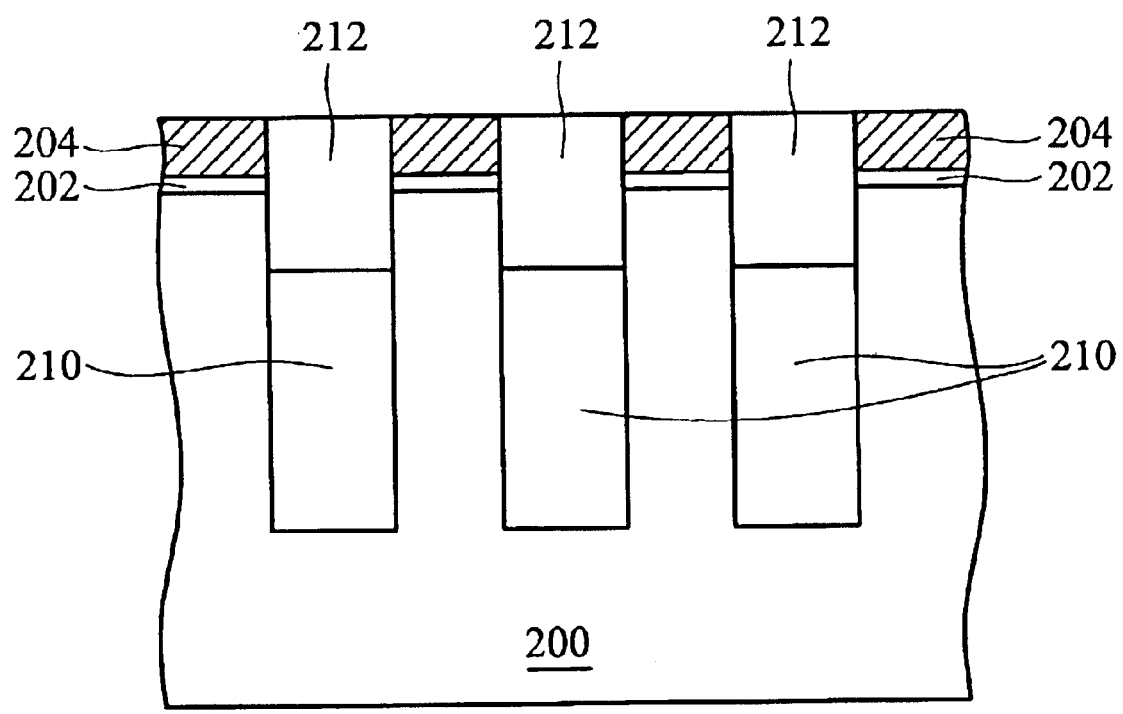

Finally, in FIG. 2g, the excess insulating layer 212 formed on the pad nitride layer 204 is removed by CMP. Subsequently, the insulating layer 212 is annealed to finish the shallow trench isolation structure fabrication. It is noted that the annealing temperature cannot be so high as to deposit impurities into the remaining SOG layer 210, diffusing into the insulating layer 212 and causing poor reliability of the isolation structure. In this invention, the annealing is performed at 750° C.~1000° C. for 30~60 min.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a trench isolation structure, comprising the steps of:
   providing a substrate having at least one trench;
   filling the trench with a spin on glass layer;
   performing a baking on the spin on glass layer;
   etching back the spin on glass layer to a predetermined depth;
   performing a curing on the etched back spin on glass layer;
   forming an insulating layer on the cured spin on glass layer; and
   annealing the insulating layer.

2. The method as claimed in claim 1, wherein the insulating layer is annealed at about 700° C.~1000° C.

3. The method as claimed in claim 1, wherein the insulating layer is annealed for about 30~60 min.

4. The method as claimed in claim 1, wherein the aspect ratio of the trench is more than 3.

5. The method as claimed in claim 1, wherein the temperature of the baking is lower than the curing.

6. The method as claimed in claim 1, wherein the baking is performed for about 30~60 mm.

7. The method as claimed in claim 1, wherein the spin on glass layer is etched by buffer oxide etch solution (BOE).

8. The method as claimed in claim 7, wherein the proportional volume of ammonium fluoric ($NH_4F$) to hydrofluoric (HF) acid in BOE is about 50~200:1.

9. The method as claimed in claim 7, wherein the proportional volume of $NH_4F$ to HF acid in BOE is about 100:1.

10. The method as claimed in claim 1, wherein the baking is performed below 400° C. and the curing is performed at about 750° C.~1000° C.

11. The method as claimed in claim 1, wherein the curing is performed for about 30~60 min.

12. The method as claimed in claim 1, wherein the predetermined depth is about 500~1000 Å.

13. The method as claimed in claim 1, wherein the insulating layer is high-density plasma oxide.

14. A method for forming a trench isolation structure, comprising the steps of:
   providing a substrate successively coated by a pad oxide layer and a pad nitride layer;
   etching the pad nitride layer and the underlying pad oxide layer to form at least one trench in the substrate;
   forming a spin on glass layer on the pad nitride layer and filling the trench;
   performing a baking on the spin on glass layer;
   etching back the spin on glass layer to a predetermined depth;
   performing a curing on the spin on glass layer;
   forming an insulating layer on the pad nitride layer and filling the trench;
   removing the insulating layer over the pad nitride layer; and
   annealing the remaining insulating layer.

15. The method as claimed in claim 14, further polishing the spin on glass layer to expose the pad nitride layer after the baking is performed.

16. The method as claimed in claim 14, wherein the aspect ratio of the trench is more than 3.

17. The method as claimed in claim 14, wherein the temperature of the baking is lower than the curing.

18. The method as claimed in claim 14, wherein the baking is performed for about 30~60 min.

19. The method as claimed in claim 14, wherein the spin on glass layer is etched by buffer oxide etch solution (BOE).

20. The method as claimed in claim 19, wherein the proportional volume of ammonium fluoric ($NH_4F$) to hydrofluoric (HF) acid in BOE is about 50~200:1.

21. The method as claimed in claim 19, wherein the proportional volume of $NH_4F$ to HF acid in BOE is about 100:1.

22. The method as claimed in claim 14, wherein the baking is performed below 400° C. and the curing is performed at about 750° C.~1000° C.

23. The method as claimed in claim 14, wherein the curing is performed for about 30~60 min.

24. The method as claimed in claim 14, wherein the predetermined depth is about 500~1000 Å.

25. The method as claimed in claim 14, wherein the insulating layer is high-density plasma oxide.

26. The method as claimed in claim 14, wherein the insulating layer is annealed at about 700° C.~1000° C.

27. The method as claimed in claim 14, wherein the insulating layer is annealed for about 30~60 min.

* * * * *